United States Patent [19]
Yeh et al.

[11] Patent Number: 5,897,371
[45] Date of Patent: Apr. 27, 1999

[54] ALIGNMENT PROCESS COMPATIBLE WITH CHEMICAL MECHANICAL POLISHING

[75] Inventors: Kuantai Yeh, Redwood City; Ahmad Chatila, Santa Clara; Shahin Sharifzadeh, Menlo Park, all of Calif.

[73] Assignee: Cypress Semiconductor Corp., San Jose, Calif.

[21] Appl. No.: 08/769,766

[22] Filed: Dec. 19, 1996

[51] Int. Cl.⁶ .............................................. H01L 21/4763
[52] U.S. Cl. ...................... 438/633; 438/692; 438/699; 438/975
[58] Field of Search .......................... 437/228; 438/481, 438/633, 692, 699, 702, 799, 626, 975

[56] References Cited

U.S. PATENT DOCUMENTS

| | | | |
|---|---|---|---|
| 4,789,648 | 12/1988 | Chow et al. | 437/225 |
| 4,933,743 | 6/1990 | Thomas et al. | 357/71 |
| 4,954,142 | 9/1990 | Carr et al. | 51/309 |
| 5,262,354 | 11/1993 | Cote et al. | 437/195 |
| 5,271,798 | 12/1993 | Sandhu et al. | 156/638 |
| 5,371,047 | 12/1994 | Greco et al. | 437/238 |
| 5,397,741 | 3/1995 | O'Connor et al. | 437/187 |
| 5,401,691 | 3/1995 | Caldwell | 437/228 |
| 5,433,651 | 7/1995 | Lustig et al. | 451/6 |
| 5,456,756 | 10/1995 | Ramaswami et al. | 118/721 |
| 5,477,058 | 12/1995 | Sato | 250/548 |
| 5,503,962 | 4/1996 | Caldwell | 430/317 |
| 5,504,036 | 4/1996 | Dekker et al. | 437/183 |
| 5,738,961 | 4/1998 | Chen | 430/22 |

OTHER PUBLICATIONS

Calibration of Chemically Amplified Reset Models SPIE vol. 2724 pp. 156–162 No Date.

Dynamic Performance of a Scanning X-Y Stage for Automatic Electron-Beam Inspection J. Vac. Sci. Technol. B 10(6), Nov./Dec. 1992 pp. 2368–2642.

Study of the Relationship Between Exposure Margin and Photolithographic Process Latitude and Mask Linearity SPIE vol. 1463 Optical/Laser Microlithography IV (1991) pp. 230–244 No Month.

*Primary Examiner*—Charles Bowers
*Assistant Examiner*—Reneé R. Berry
*Attorney, Agent, or Firm*—Christopher P. Maiorana

[57] ABSTRACT

The present invention concerns a process that maintains a second (or "replica") set of alignment marks during existing processing steps used in manufacturing a semiconductor device or integrated circuit, including CMP and other planarization methods. The present invention avoids alignment problems encountered in conventional CMP processes, particularly tungsten CMP. All alignment steps can be realized through one or more subsequent second (or "replica") alignment marks, set and preserved throughout the remaining process steps, thus maintaining alignment integrity. The present method and apparatus concerns a new alignment mark that may be "printed" in a metal layer on the wafer, for example, a local interconnect or contact layer. The new alignment mark is generally not subjected to planarization or to an "open frame" process. The new alignment mark may also be used to re-etch other alignment marks directly onto the layer conventionally causing alignment problems, such as those created following CMP.

8 Claims, 2 Drawing Sheets

5,897,371

ALIGNMENT PROCESS COMPATIBLE WITH CHEMICAL MECHANICAL POLISHING

FIELD OF THE INVENTION

The present invention relates to a photolithographic alignment process generally and more particularly to a new alignment mark to improve a photolithography alignment process that is compatible with CMP (chemical mechanical polishing).

BACKGROUND OF THE INVENTION

In semiconductor or integrated circuit manufacturing, large scale integration (LSI) or very large scale integration (VLSI) techniques may be used to fabricate complex electrical circuits on a silicon substrate. The design and manufacture of many devices have been made possible by the reduction in the memory cell dimensions. A photolithography step is frequently utilized to transfer an electrical pattern from a photomask to a silicon wafer. Various photolithographic systems use a variety of transfer techniques, including step-and-repeat processes, to gradually transfer a mask pattern from a macroscopic prototype to a microscopic implementation.

As device memory cell dimensions continue to shrink, the overlay measurement accuracy (to compensate for processing inaccuracies) generally requires alignment marks to be created in the silicon substrate to be used as a reference coordinate. The alignment marks are created by various processing steps. Global alignments between masking layers are generally done by measuring contrasts in light intensities reflected back from the steps created by the elevated portions of the alignment marks. Generally, as long as the step heights in the alignment marks are preserved through subsequent processing steps, global alignment in masking steps (compared to the masking layers) can be achieved. As critical dimensions (CD) of individual transistors transferred from a mask pattern shrink in extremely dense devices, global planarization at the wafer level therefore becomes quite advantageous.

Chemical Mechanical Polishing (CMP) is an industry recognized process for making silicon wafers flat. The CMP process is used to achieve global planarization (planarization of the entire wafer). Both chemical and mechanical forces produce the desired polishing of the wafer. The CMP process generally includes an automated rotating polishing platen and a wafer holder. The wafer holder is generally used to hold the wafer in place while the platen exerts a force on the wafer. At the same time, the wafer and platen may be independently rotated. A polishing slurry feeding system may be implemented to wet the polishing pad and the wafer. The polishing pad bridges over relatively low spots on the wafer, thus removing material from the relatively high spots on the wafer. Planarization occurs because generally high spots on the wafer polish faster than low spots on the wafer. Thus, the relatively high portions of the wafer are smoothed to a uniform level faster than the other, relatively low portions of the wafer.

After CMP, the various portions of the wafer, including the alignment marks, become relatively flat. Planarizing the alignment marks creates problems for providing proper alignment during subsequent masking steps.

One typical way to get around planarizing the alignment marks is to perform a processing step called "open frame" which reproduces the step height in the alignment marks.

Tungsten deposition and CMP are typically used to fabricate tungsten contacts. Thus, Tungsten CMP (WCMP) is one notable variation of CMP. Tungsten is generally preferred to aluminum for contacts due to step coverage problems that arise in high aspect ratio holes during aluminum deposition. After tungsten CMP, the original alignment marks may be covered with a layer of tungsten film. The grain quality of the tungsten film typically produces poor light reflection quality and therefore makes alignment of the mask pattern difficult to control. As a result, alignment marks may be rendered ineffective after tungsten CMP.

SUMMARY OF THE INVENTION

The present invention concerns a process that generates and maintains a second set of alignment marks during subsequent processing steps in manufacturing a semiconductor device or integrated circuit, including CMP and other planarization methods. The present invention avoids the alignment problems encountered in CMP processes, particularly tungsten CMP. All alignment steps can be realized through two or more sets of alignment marks one of which is found subsequent to the other (a "replica" set of alignment marks). This "replica" set is preserved throughout the remaining process steps, thus maintaining alignment integrity where it might otherwise be lost.

The present method and apparatus concern an alignment mark "printed" in a metal layer on the wafer, for example, a local interconnect layer (referred to generally as "LI"). The local interconnect layer may have a thickness of from 500 Å to 2000 Å, preferably from 700 Å to 1500 Å, more preferably approximately 1000 Å. Subsequent to depositing the local interconnect layer, masking and etching steps may be conducted for form the local interconnect. The LI1 mask step height may be from 500 Å to 2500 Å, preferably from 800 Å to 1600 Å, more preferably approximately 1200 Å. Next, a metal layer (generally referred to as LI2) is deposited that may completely encapsulate the replica alignment mark. As a result, the replica alignment mark may be preserved. The replica alignment mark generally is not subjected to an "open frame" process. Thus, the replica alignment mark may survive CMP when used to planarize on the local interconnect layer. The replica alignment mark may then be used to re-etch other alignment marks directly onto the layer on which CMP was performed.

The objects, features and advantages of the present invention include providing a replica alignment mark that survives CMP (or WCMP). The present invention produces the desired alignment mark(s) by avoiding "open frame" processing prior to encapsulating the replica alignment mark. The replica alignment mark may be used to re-etch additional alignment marks in other portions of the wafer for use in subsequent photolithographic processing.

BRIEF DESCRIPTION OF THE DRAWINGS

These and other objects, features and advantages of the present invention will be apparent from the following detailed description and the appended claims and drawing in which:

DETAILED DESCRIPTION OF THE PREFERRED EMBODIMENTS

Figure 1:
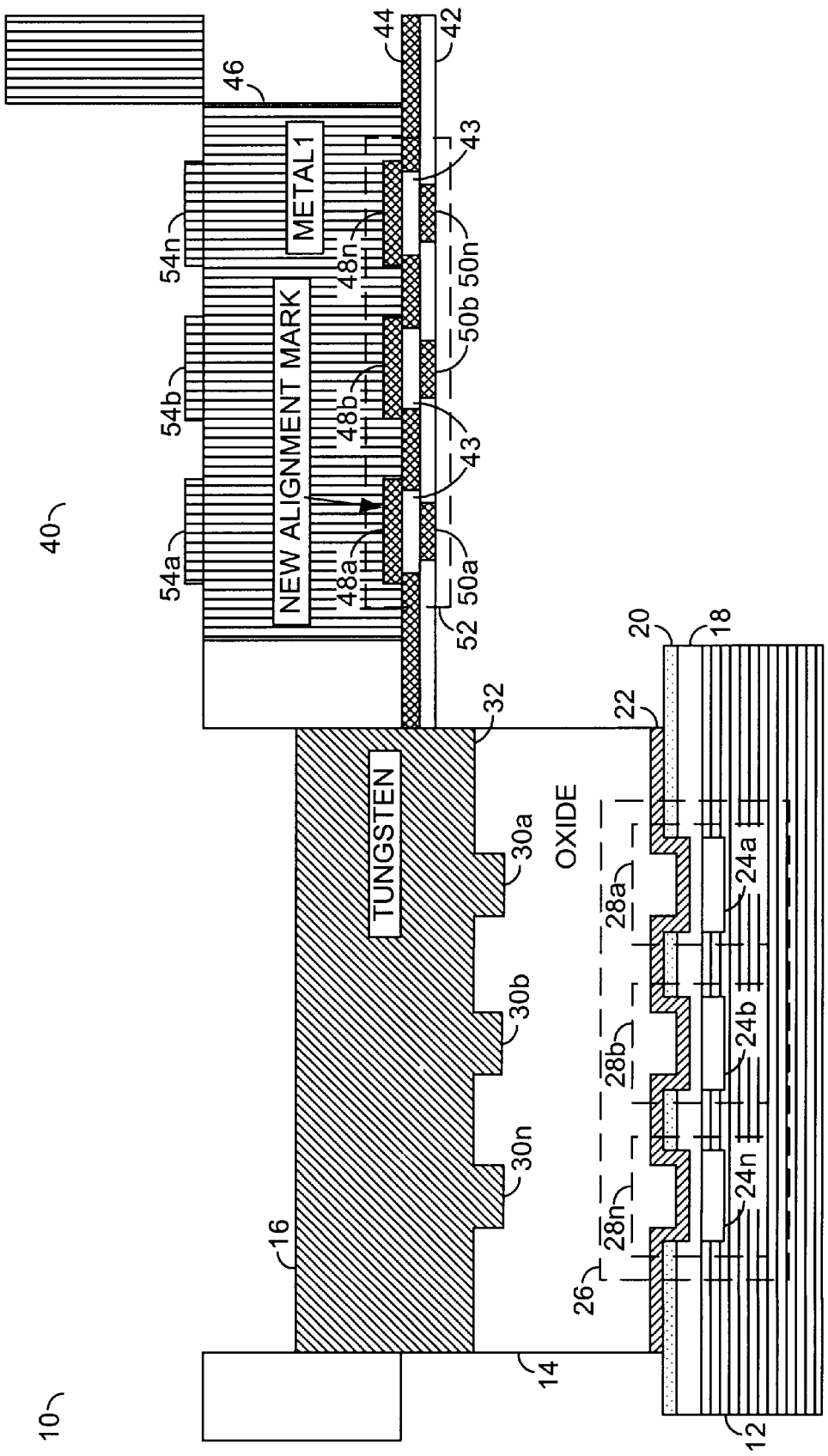
FIG. 1 is a cross-sectional diagram of a preferred embodiment of the present invention.

FIG. 1 shows a cross-sectional diagram of a preferred embodiment of the present invention. A wafer 10 having two sets of alignment marks 2b and 2i (See FIG. 1) generally comprises a substrate layer 12, an oxide layer 14 and a conductive layer 16. The substrate layer 12 may have a field oxide layer 18 and/or a gate material layer 20 deposited thereon.

The substrate may comprise any of the materials known to those of ordinary skill in the art to be useful for semiconductors and/or integrated circuits, such as silicon, which may be lightly and/or heavily doped with N-type dopants (such as phosphorous, arsenic and/or antimony) and/or P-type dopants (such as boron) according to conventional doping processes; germanium; gallium arsenide; aluminum gallium arsenide; and mixtures thereof (such as silicon germanium, having the formula $Si_xGe_{1-x}$). The substrate may further comprise an insulator base (thus forming a so-called "semiconductor-on-insulator" or "SOI" device).

The oxide layer 14 and field oxide layer 18 may independently comprise conventional silicon dioxide, which may be doped with conventional doping agents such as boron (thus forming a borosilicate glass, or "BSG"), phosphorous (thus forming a phosphosilicate glass, or "PSG"), both boron and phosphorous (thus forming a borophosilicate glass, or "BPSG"), or aluminum (thus forming an aluminosilicate glass); a conventional silicon oxynitride; a conventional silicon nitride; or any combination thereof. The oxide layer and field oxide layer 18 may be formed by any of the methods known to those of ordinary skill in the art for forming an oxide layer ion a semiconductor and/or integrated circuit.

The conductor layer 16 may comprise an electrically conductive material (e.g., any material having a resistivity of 100 Ω/cm or less, preferably 10 Ω/cm or less, more preferably 1 Ω/cm or less). In regions of the wafer not containing an alignment mark, the conductor layer may provide a conventional function (such as providing a signal to a circuit element, connecting a source or drain of a transistor to a signal line or bus, etc.), or take a conventional form (such as a contact, via, interconnect, wordline, bitline, bus, etc.). Suitable materials include metals such as aluminum, titanium, zirconium, chromium, molybdenum, tungsten, manganese, iron, cobalt, nickel, palladium, platinum, copper, silver, gold, etc.; alloys thereof such as titanium tungsten, aluminum tungsten, and aluminum copper; alloys thereof with silicon, such as titanium silicide, tungsten silicide and aluminum silicide; polysilicon heavily dopes (i.e., at least $10^{-18}$ atoms/cm$^3$) with either an N-type dopant or one or more P-type dopants; and mixtures and multi-layer combinations thereof. Preferably, the conductor layer 16 comprises tungsten, aluminum or copper, most preferably tungsten.

A functional layer 22 may be further deposited onto layer 18 and/or layer 20 to form an insulative barrier (e.g., a layer such as silicon nitride that may also inhibit etching of underlying layers by conventional oxide elements), an atom migration barrier (e.g., a layer such as titanium nitride, inhibiting atom migration from an overlying dielectric into the underlying gate metal layer), a low resistance layer (e.g., a layer such as titanium silicide or tungsten silicide, that lower contact resistance between the underlying gate material, interposed between substrate 12 and the oxide layer 14.

In a conventional alignment mark, a number of steps 28a~28n are generally formed first in the substrate layer 12. The steps are then generally overlaid by etching a trench pattern (a plurality of lines or trenches) into the substrate with the substances from subsequently formed layers. A "set" of alignment marks generally comprise one or more steps 28a~28n, the height of which may be defined as the distance from the upper surface 24 of an unetched region of substrate to the upper surface 25 of an etched region of substrate or upper surfaces of layers overlying such regions, as long as such overlying layers are not planarized; (see also U.S. Pat. No. 5,401,691, the relevant portions of which are hereby incorporated herein by reference).

The height of each of the steps 28a~28n is generally uniform across the steps and is maintained as subsequent unplanarized layers are deposited or formed thereon. The oxide layer 14 is deposited over (and generally covers) layers 18, 20 and 22. The oxide layer 24 that fills the steps 28a~28n also creates a new set of steps 30a~30n at the upper surface of the oxide 14.

The step height of the alignment mark(s) are generally maintained in layers 18, 20 and 22 and oxide layer 14. A problem may arise from conductive layer 16. First, many conductive materials are opaque to the wavelengths of light conventionally used in semiconductor and/or integrated circuit alignment, thus rendering use of alignment marks in underlying layers difficult, if not impossible. Consequently, alignment marks tend to be effectively erased by a planarized opaque layer of material. Second, planarization of the uppermost or outermost layer eliminates any steps therein. The alignment marks thus tend to be erased by techniques used in modern semiconductor and/or integrated circuit manufacturing processes.

The first and second conductive layers in region 40 may also comprise an electrically conductive material or materials as described above. Preferably, however, the first conductive layer and the functional layer in region 40 independently comprise a material providing a conventional circuit element interconnect function, such as titanium, aluminum, copper, a heavily-doped polysilicon and/or a metal silicide, more preferably titanium. The functional layer in region 40 may alternatively or additionally provide a conventional atom migration barrier function (such as titanium nitride), etch stop or etch inhibition function (such as silicon nitride), resistance-lowering function (such as titanium tungsten alloy), conductive material adhesion function (such as titanium or chromium) or any combination of such functions and/or materials providing such functions. More preferably, the functional layer in region 40 comprises titanium. The second conductive layer in region 40, which may provide a conventional integrated circuit bus function, preferably comprises a lower layer of titanium tungsten alloy, a center layer of aluminum and an upper layer of titanium tungsten alloy overlying functional layer 44.

A second section 40 (which may or may not be adjacent to section 16) of the wafer is used to create a second set of alignment marks (e.g., "replica" marks) and thus maintain alignment for subsequent photolithography steps. Second section 40 generally does not have conductive layer 16 thereon. This prevents loss or erasure of replica marks located in the second section 40, thus maintaining a functional set of alignment marks after CMP is performed on other portions of the wafer (e.g., region 16) having an opaque material thereon.

The second section 40 generally comprises a first conductive layer 50, an insulative layer 42, a functional layer 44, a second conductive layer 46, and a set 52 of alignment marks.

The alignment marks 48a~48n are generally formed by first etching a number of lines, trenches or other features 50a~50n in layer 42 into which the material of the first conductive layer may be deposited in a preferred embodiment, part or all of insulating layer 42 is formed at the same time as part of all of oxide layer 14. In one embodiment, the uppermost portions (i.e., the surface of which is exposed after formation) of insulating layer 42 is co-extensive with the uppermost portion of oxide layer 14 (e.g., having outermost or exposed surfaces in substantially the same horizontal plane). After deposition, excess conductive material may be removed by conventional planarization and/or etching processes, preferably such that its outermost or exposed surface is coextensive with the outermost or exposed surface of insulating layer 42. An additional layer of insulating material may be deposited, over which a conventional photoresist is deposited. The photoresist is then patterned (e.g., irradiated and developed) by conventional methods, the exposed insulating material is etched, and the remaining photoresist is removed to form insulating layer 43. Similar processing steps (depositing, patterning, planarizing and/or etching, and removing photoresist) may be used to form functional layer 44.

Alternatively, the material of the first conductive layer may be deposited over a planarized underlying layer. The first conductive material may then he patterned with a conventional photoresist, etched and the remaining photoresist removed to provide first conductive Layer 50. Insulating layer 42~43 and functional layer 48 may be formed in a conformal fashion by the sequence described above (depositing, patterning, planarizing and/or etching, and removing photoresist) or by selecting materials and the deposition method and conditions providing a substantially conformal layer to be formed over first insulating layer 50 (and/or any step-containing layer formed thereon).

Thus, the replica alignment marks 48a~48n are generally formed before conductive layer 16 is deposited on/in the first region 16. The material of the conductive layer 16 is then deposited (typically to a uniform depth over the entire outermost surface of the wafer) and planarized. The conductive layer 16 is not formed in region 40 as long as the outermost surface of region 40 (typically that of layer 48) is higher than (e.g., a greater distance from substrate 12 relative to) the outermost surface of region 16. After depositing and planarizing the metal layer 46 is then formed over the replica marks 50a~50n. The metal layer 46 is generally a conformal material and maintains the marks 50a~50n. As a result, a set of visible marks 54a~54n are created on the top of the metal layer 46. The visible marks 54a~54n may then be used in the photolithographic processing step to recreate the steps 30a~30n to provide proper alignment throughout the remaining processing steps.

The following TABLE 1 illustrates a specific sequence of various masking steps in creating the first and second alignment marks:

TABLE 1

| Step | Job | Alignment Mark | Affected Lynch |
|------|-----|----------------|----------------|
| 0 |  | First Marks Formed |  |
| 1 | LICM1 | No Openframe | Mark #1 |
| 2 | OFM | Open frame Mask #1 | N/A |
| 3 | LI1M | (LI1) | Mark #1 |
| 4 | LICM2 | No Openframe | Mark #1 |
| 5 | LI2M | No Openframe | Mark #1 |
| 6 | CTM1 | No Openframe | Mark #1 |
| 7 | OFM2 | Openframe Mask #2 | N/A |
| 8 | MM1 | No Openframe | Mark #2 | CTM1-MM1 |

TABLE 1-continued

| Step | Job | Alignment Mark | Affected Lynch |
|------|-----|----------------|----------------|
| 9 | VIM | No Openframe | Mark #2 |
| 10 | OFM3 |  |  |

The first masking step (LICM1) comprises forming a first local interconnect mask on or over gate material layer 20. The first local interconnect mask may cover the areas of the substrate or layer 20 that will not be etched in making the first alignment mark. The second masking step (OFM) corresponds to an "openframe" process to generate the first set of alignment marks (Mark#1). The OFM step covers those areas and/or regions of second section 40 that are not intended to be etched. Steps following OFM, but preceding LI1M, include patterning (preferably by irradiating) those regions of the mask to be etched or not be etched (depending on whether the mask material is, for example, a positive or negative photoresist material, as is known to those of ordinary skill in the art); developing the irradiated mask (preferably by removed the undesired portion[s] of the mask with a solvent and/or by etching); partially or wholly removing (preferably by etching, more preferably by plasma etching) the exposed portions(s) of the material of one or more underlying layer(s); removing the remaining portion(s) of the mask; depositing a Local interconnect material (preferably an electrically conducing material); and removing sufficient portions of local interconnect material to independently electrically connect at least a first group of one or more functional regions of an integrated circuit to at least a second group of one or more functional regions of the integrated circuit.

The third masking step (LI1M) creates a second mark (Mark#2), which generally includes the new alignment mark 48a~48n. The fourth and fifth masking steps (in which a second set or system of local interconnects are formed [LICM2 and/or LIM2] may or may not affect the alignment marks. Preferably, during those intermediate steps between masking steps when the alignment marks are useful (e.g., irradiating a mask or photoresist), the alignment marks are exposed or exposeable to the wavelengths(s) of light (preferably ultraviolet light) at which the alignment marks are functional. Alternatively, one may use the original set of alignment marks during formation of the first set of local interconnects, with or without subsequently depositing interconnect or interconnect-related materials thereon, then create a first set of replica alignment marks during formation of the second set of local interconnects, or one may form sets of replica marks during both interconnect formation processes. In a further alternative, one may form the entire system of local interconnects in one or two mask cycles (e.g., steps between mask steps, including one of the mask steps; see, for example, the copending U.S. patent application entitled "Edge Metal for Interconnect Layers," filed on Nov. 21, 1996, having Attorney Docket No. 16820.P171 and Ser. No. 08/754,521).

The sixth step (CTM1) comprises forming a contact mask and may also contribute part of the creation of the first and/or second set(s) of replica mark(s). A series of steps comprising depositing one or more interlevel dielectric materials and etching (and/or polishing and/or planarizing) the interlevel dielectric material(s) may occur between the final local interconnect-forming step and forming (or depositing) the contact mask material. Intermediate steps between CTM1 and MM1 are similar to the intermediate steps described above (patterning, developing, removing exposed underlying material, removing remaining mask region[s], depositing contact material [e.g., layer 16 in FIG. 1], and removing sufficient portions of contact material [preferably by CMP] to electrically connect at least one first functional feature [e.g., a metal bus line] to at least one second functional feature [e.g., a gate and/or a source or drain ("diffusion") region of a transistor] of the integrated circuit). However, the contact(s) formed may be opaque to the (ultraviolet) light used to align a reticle in subsequent patterning and/or irradiation steps. Consequently, in such a circumstance, it is useful to cover the section 40 (in which the set of replica alignment marks have been made) with the CTM1 mask material, but not remove the mask material from this section prior to the step of removing underlying material (and/or the steps of depositing contact material and/or removing contact material, after which it may then be useful to remove the remaining mask material). This effectively protects the replica alignment marks from being covered with an opaque material prior to the next patterning and/or irradiation step.

The seventh step includes performing a second openframe process (if necessary and/or desired). The eighth step (MM1) is a metal mask 1 step that is generally performed on the second (i.e., "new") replica alignment mark(s). After forming (or depositing) the first-layer metal mark (MM1) material, subsequent intermediate steps (i.e., prior to VIM) may include patterning (preferably by irradiating and developing) the MM1 material, removing (preferably by etching) exposed metal regions, removing the remaining mask material, and depositing an interlevel dielectric material. In one embodiment, the interlevel dielectric material completely covers the integrated circuit (except for subsequently formed bond pads) All following steps are thus optional.

The ninth step comprises forming a via mask which may or may not affect the second (or new) replica alignment mark(s) Intermediate steps (i.e., between VIM and OFM3/MM2 [second-level metal (not shown or described, but generally the same as first-level metal plus the possible via connections between the two levels of metal]) are generally the same as between CMP1 and MM1. The tenth step (OFM3) may repeat the openframe process on the wafer, should subsequent processing be desired (e.g., to for additional, electrically functional levels such as a third level of metal for voltage supply bus lines).

After the new (a second) replica alignment mark is created, the old alignment marks may also be recreated on top of the tungsten by etching away a portion of the tungsten 16 (e.g., during OFM2 processing). The portion of the tungsten 16 removed to recreate the old alignment marks is positioned in reference to the replica alignment mark(s) in second section 40. Since the metal layer 46 may be deposited over only the replica alignment mark(s), planarization of contact 16 does not erase the steps 54a~54n. The steps 54a~54n are then used to align the creation of a further set (e.g., a third or greater set) of alignment marks in the contact material 16. The recreated alignment mark(s) may have the same height(s) and other dimensions as the original (first) set of alignment marks or any set of replica alignment marks.

Figure 2:
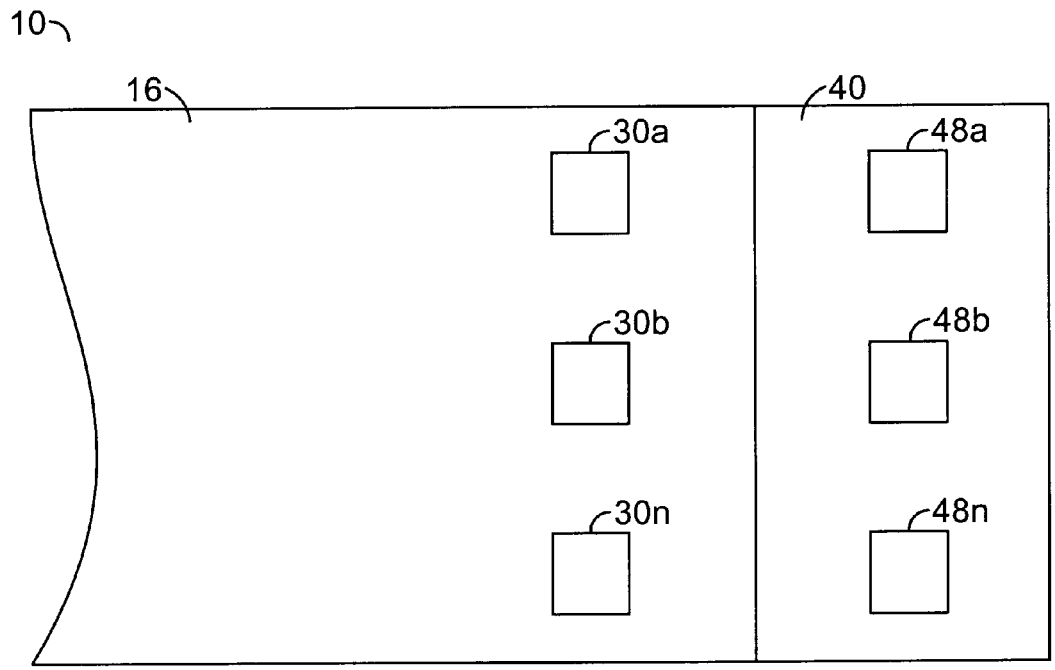
FIG. 2 is a top view of a wafer having replica alignment marks fabricated by the process of FIG. 1.

Referring to FIG. 2, a top view of the wafer 10 is shown. The planarized layer 16 is shown having the steps 30a, 30b and 30n. The second section 40 is shown having the new alignment marks 48a, 48b and 48n. The shape of the steps 30a, 30b and 30n, as well as the shapes of the alignment marks 48a, 48b and 48n are shown to be generally square for illustrative purposes only. The shape of the steps 30a, 30b and 30n, as well as the shapes of the alignment marks 48a, 48b and 48n, may be adjusted to fit the design criteria of a particular application (e.g., rectangular to conform to the alignment mark area shapes shown in FIG. 3B). In the configuration shown in FIG. 2, after the planarized layer 16 is created (e.g., following CMP), the steps 30a, 30b and 30n may be recreated in the layer of contact material (e.g., a unopaque material such as tungsten 16). Each of the alignment marks may be positioned by taking a reference from the alignment marks 48a, 48b and 48n. For example, using three distinct alignment marks 48a, 48b and 48n, any of the steps 30a, 30b or 30n may be triangulated to the appropriate portion of the layer 16. After the steps 30a, 30b and 30n (and/or their associated heights) are recreated in layer 16, the fabrication process may be continued.

Figure 3:
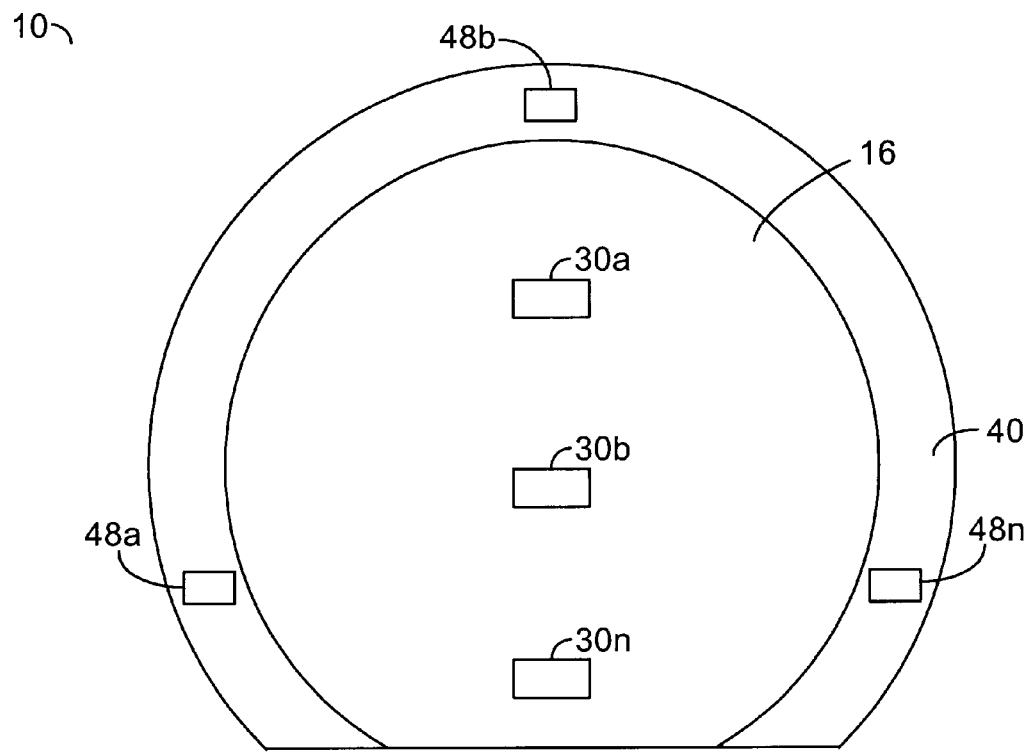
FIG. 3 is an alternate top view of a wafer having replica alignment marks fabricated by the process of FIG. 1.

Referring to FIG. 3, a top view of the wafer 10 is shown. The planarized layer 16 is shown having original alignment marks 38a, 30b and 30n. The second section 40 is shown having replica alignment marks 48a, 48b and 48n. The particular location of the alignment marks 48a~48n may be adjusted to fit the design criteria is of a particular application so long as they are generally located within a second section 40 (e.g., in FIG. 3). As a result, the integrity of the alignment marks 48a~48n may be preserved. After CMP, the steps 30a~30n may be recreated within the planarized layer 16 to provide proper alignment for the subsequent steps. The particular location of the steps 30a~30n may be anywhere within the planarized layer 16.

While the invention has been particularly shown and described with reference to preferred embodiments thereof, it will be understood by those skilled in the art that various changes in form and details may be made without departing from the spirit and scope of the invention.

We claim:

1. A method for generating an alignment mark for use in a photolithographic system comprising the steps of:

forming a first alignment mark in a first location of a semiconductor wafer;

forming a replica alignment mark in a second location of said semiconductor wafer referenced by said first alignment mark separate from said first location;

forming over said first alignment mark a planarized and/or opaque metal layer;

forming a second alignment mark in a third location on said semiconductor wafer referenced by said replica alignment mark, said third location being separate from said second location; and continuing the fabrication process.

2. The method according to claim 1, wherein said step of forming said planarized and/or opaque metal layer comprises:

performing a Chemical Mechanical Polishing (CMP) process.

3. The method according to claim 2 wherein said metal layer comprises tungsten.

4. The method according to claim 2 further comprising:

depositing a layer of conformal material on said wafer prior to forming said second alignment mark.

5. A method for generating an alignment mark for use in a photolithographic system comprising the steps of:

etching a first alignment mark having a step height in a first location of a semiconducting wafer;

etching a second alignment mark in a second location of said semiconducting wafer referenced by said first alignment mark separate from said first location;

coating said first alignment mark with a metal layer;

polishing said wafer sufficient to substantially planarize said metal layer; and etching a third alignment mark in a third location of said semiconducting wafer using said second alignment mark as a reference.

6. The method according to claim 5 wherein said polishing step comprises Chemical Mechanical Polishing (CMP).

7. The method according to claim 6 wherein said metal layer comprises tungsten.

8. The method according to claim 5 wherein said metal layer comprises a non-conformal material.

\* \* \* \* \*